(12) United States Patent
Ozaki et al.

(10) Patent No.: US 9,165,851 B2
(45) Date of Patent: Oct. 20, 2015

(54) SEMICONDUCTOR DEVICE, METHOD FOR MANUFACTURING THE SAME, POWER SUPPLY APPARATUS AND HIGH-FREQUENCY AMPLIFICATION UNIT

(75) Inventors: Shirou Ozaki, Yamato (JP); Masayuki Takeda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 298 days.

(21) Appl. No.: 13/597,557

(22) Filed: Aug. 29, 2012

(65) Prior Publication Data

US 2013/0069175 A1 Mar. 21, 2013

(30) Foreign Application Priority Data

Sep. 15, 2011 (JP) .................................. 2011-202038

(51) Int. Cl.
  *H01L 29/66* (2006.01)
  *H01L 23/31* (2006.01)
  *H01L 29/778* (2006.01)
  *H01L 29/417* (2006.01)
  *H01L 29/423* (2006.01)
  *H01L 29/51* (2006.01)
  *H01L 29/20* (2006.01)
  *H01L 23/29* (2006.01)

(52) U.S. Cl.
  CPC ...... *H01L 23/3171* (2013.01); *H01L 29/66462* (2013.01); *H01L 29/7786* (2013.01); *H01L 23/291* (2013.01); *H01L 29/2003* (2013.01); *H01L 29/41766* (2013.01); *H01L 29/4236* (2013.01); *H01L 29/517* (2013.01); *H01L 2924/0002* (2013.01)

(58) Field of Classification Search
  None
  See application file for complete search history.

(56) References Cited

U.S. PATENT DOCUMENTS

| 7,638,818 | B2 * | 12/2009 | Wu et al. ........................ 257/192 |
| 8,569,124 | B2 * | 10/2013 | Akiyama et al. .............. 438/197 |
| 2006/0113971 | A1 * | 6/2006 | Watanabe et al. ............. 323/265 |
| 2007/0114569 | A1 | 5/2007 | Wu et al. |
| 2007/0249119 | A1 | 10/2007 | Saito |
| 2010/0163928 | A1 * | 7/2010 | Imada et al. ................... 257/194 |
| 2011/0272742 | A1 * | 11/2011 | Akiyama et al. .............. 257/194 |
| 2012/0307534 | A1 | 12/2012 | Yamada |

FOREIGN PATENT DOCUMENTS

| JP | 5-335346 A | 12/1993 |
| JP | 2007-81346 | 3/2007 |
| JP | 2007-294528 A | 11/2007 |
| JP | 2009-76845 A1 | 4/2009 |
| JP | 2010-10584 | 1/2010 |
| JP | 2010010584 A * | 1/2010 |
| JP | 2011-171595 | 9/2011 |
| WO | 2011108063 A1 | 9/2011 |

OTHER PUBLICATIONS

Notification of Preliminary Rejection mailed Jul. 29, 2013 from the Korean Intellectual Property Office in counterpart application No. 10-2012-99709 with English translation.

(Continued)

*Primary Examiner* — Benjamin Sandvik
(74) *Attorney, Agent, or Firm* — Kratz, Quintos & Hanson, LLP

(57) ABSTRACT

A semiconductor device includes a compound semiconductor multilayer structure, a fluorine-containing barrier film that covers a surface of the compound semiconductor multilayer structure, and a gate electrode that is arranged over the compound semiconductor multilayer structure with the fluorine-containing barrier film placed the gate and the compound semiconductor multilayer structure.

11 Claims, 6 Drawing Sheets

(56) References Cited

OTHER PUBLICATIONS

Chinese Office Action dated Sep. 29, 2014 in the corresponding Chinese patent application No. 201210334605.5, with English translation.

Taiwanese Office Action dated Oct. 9, 2014 in the corresponding Taiwanese patent application No. 101131139, with English translation.

Ambacher (PI), Prof. Dr. Oliver, et al., "Pyroelectric AlGaN/GaN HEMT's for ion-, gas- and polar-liquid sensors," NICOP Progress Report, $18^{th}$ month (2004), 16 pages plus two pages of Report Documentation Page.

Japanese Office Action for the Corresponding JP Application No. 2011-202038, mailed on Feb. 24, 2015.

* cited by examiner

SEMICONDUCTOR DEVICE, METHOD FOR MANUFACTURING THE SAME, POWER SUPPLY APPARATUS AND HIGH-FREQUENCY AMPLIFICATION UNIT

CROSS-REFERENCE TO RELATED APPLICATION

This application is based upon and claims the benefit of priority of the prior Japanese Patent Application No. 2011-202038, filed on Sep. 15, 2011, the entire contents of which are incorporated herein by reference.

FIELD

The embodiments discussed herein are related to a semiconductor device, a method for manufacturing the semiconductor device, a power supply apparatus, and a high-frequency amplification unit.

BACKGROUND

Among semiconductor devices including a compound semiconductor multilayer structure containing a compound semiconductor such as nitride semiconductor are, for example, GaN high-electron mobility transistors (GaN-HEMTs).

GaN has excellent material properties such as high dielectric strength, relatively high mobility in the case of using a two-dimensional electron gas, and high saturated electron drift velocity and therefore the GaN-HEMTs are under development as power devices, enabling high-power, high-efficiency, high-voltage operation, for power supply applications. In other words, the GaN-HEMTs are under development as power devices, enabling high-power, high-efficiency, high-voltage operation, for power supply applications because it is difficult for Si laterally diffused metal oxide semiconductor (LDMOS) transistors and GaAs field-effect transistors (FETs) to apply to such power devices.

In a semiconductor device including such a compound semiconductor multilayer structure, when a surface of the compound semiconductor multilayer structure has nitrogen defects (dangling bonds) and a gate electrode is placed above the compound semiconductor multilayer structure, the dangling bonds act as electron traps and therefore the threshold voltage varies.

In this case, the dangling bonds are terminated with fluorine in such a manner that a surface of the compound semiconductor multilayer structure is subjected to fluorine termination treatment, whereby the number of the dangling bonds is reduced and the variation of the threshold voltage is suppressed.

However, when the time that a surface of a compound semiconductor multilayer structure subjected to fluorine termination treatment is exposed to air, that is, the time elapsed until an insulating film or a gate electrode is formed on the surface thereof is long, the variation of the threshold voltage is not suppressed.

Japanese Laid-open Patent Publication No. 2009-76845 is an example of related art.

SUMMARY

According to an aspect of the invention, a semiconductor device includes a compound semiconductor multilayer structure, a fluorine-containing barrier film that covers a surface of the compound semiconductor multilayer structure, and a gate electrode that is arranged over the compound semiconductor multilayer structure with the fluorine-containing barrier film placed the gate and the compound semiconductor multilayer structure.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments are described with reference to the attached drawings.

[First Embodiment]

A semiconductor device according to a first embodiment and a method for manufacturing the semiconductor device are described with reference to FIGS. 1 to 5.

The semiconductor device is a compound semiconductor device including a compound semiconductor multilayer structure containing, for example, a compound semiconductor such as a nitride semiconductor.

In this embodiment, the compound semiconductor device is described using a FET containing a nitride semiconductor, particularly a metal insulator semiconductor (MIS)-type of AlGaN/GaN-HEMT, as an example. The AlGaN/GaN-HEMT includes a nitride semiconductor multilayer structure (HEMT structure) including an electron travel layer made of GaN and an electron supply layer made of AlGaN and also includes a gate insulating film.

The AlGaN/GaN-HEMT is also referred to as an AlGaN/GaN-FET. The nitride semiconductor multilayer structure is also referred to as a Group III-V nitride semiconductor multilayer structure, a GaN semiconductor multilayer structure, or a compound semiconductor multilayer structure. The compound semiconductor device is also referred to as a nitride semiconductor device or a Group III-V nitride semiconductor device.

Figure 1:
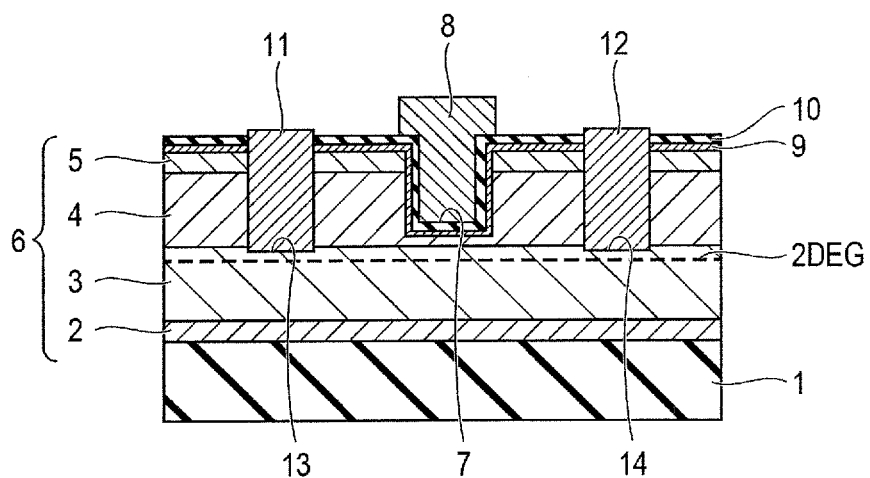
FIG. 1 is a schematic sectional view of a semiconductor device according to a first embodiment.

With reference to FIG. 1, the AlGaN/GaN-HEMT includes a SiC substrate 1 and a nitride semiconductor multilayer structure 6 including a nucleation layer 2 made of AlN, an electron travel layer 3 made of GaN, an electron supply layer 4 made of AlGaN, and a capping layer 5 made of GaN, these layers being deposited on the SiC substrate 1 in that order. In the nitride semiconductor multilayer structure 6, a two-dimensional electron gas (2DEG) is generated near the interface between the electron travel layer 3 and the electron supply layer 4. The presence of the capping layer 5 increases the strain between the electron travel layer 3 and the electron supply layer 4 to cause a piezoelectric effect, thereby increasing the 2DEG. This allows the AlGaN/GaN-HEMT to have reduced on-resistance, thereby enabling large-current operation. With reference to FIG. 1, the 2DEG is indicated by a broken line. The SiC substrate 1 is also referred to as a substrate or a semiconductor substrate. The nucleation layer 2 is also referred to as a buffer layer. The nucleation layer 2, the electron travel layer 3, the electron supply layer 4, and the capping layer 5 are also referred to as Group III-V nitride semiconductor layers.

The nitride semiconductor multilayer structure 6, which is included the AlGaN/GaN-HEMT, is not particularly limited and may be one including the electron travel layer 3 and the electron supply layer 4. For example, the nucleation layer 2 and the capping layer 5 may be made of different materials and may have a multilayer structure. The nitride semiconductor multilayer structure 6 may include no capping layer 5.

In this embodiment, the nitride semiconductor multilayer structure 6 has a gate recess 7. The gate recess 7 contains a gate electrode 8. The gate recess 7 is a groove having such a depth that a portion of the electron supply layer 4 remains. Therefore, the gate electrode 8 is located in an upper portion of the nitride semiconductor multilayer structure 6, that is, an upper portion of the electron supply layer 4, which is included in the nitride semiconductor multilayer structure 6. The gate recess 7 may have a depth reaching the electron travel layer 3. The gate recess 7 is also referred to as a recess opening or an electrode groove.

The reason for the presence of the gate recess 7 is as described below.

For power supply applications, it is important that devices have low loss and high dielectric strength and are of a normally off type in which no current flows when the gate voltage is off. In the AlGaN/GaN-HMT, a large number of electrons are present in the electron travel layer 3 because of the piezoelectric effect, which is a significant feature of the AlGaN/GaN-HEMT. This takes a major role in achieving large-current operation. However, when a device has a simple structure, the device is of a normally off type because a large number of electrons are present in an electron travel layer disposed directly under a gate while the gate voltage is off. Therefore, in order to raise the threshold voltage, the number of electrons in the electron travel layer 3 is reduced in such a manner that the gate recess 7 is formed by etching a region of the electron supply layer 4 (or the electron supply layer 4 and the electron travel layer 3) that is used to form the gate electrode 8.

In this embodiment, the AlGaN/GaN-HMT includes a fluorine-containing barrier film 9 covering a surface of the nitride semiconductor multilayer structure 6. In particular, the fluorine-containing barrier film 9 is placed over a whole surface of the nitride semiconductor multilayer structure 6 that is located on the gate electrode 8 side. That is, the fluorine-containing barrier film 9 is placed over surfaces of the electron supply layer 4 that are exposed at the wall and bottom of the gate recess 7, surfaces of the capping layer 5 that are exposed at the wall and bottom of the gate recess 7, and a surface of the capping layer S that is exposed on the gate electrode 8 side. Therefore, the gate electrode 8 is placed above the nitride semiconductor multilayer structure 6 with the fluorine-containing barrier film 9 placed therebetween.

Figure 2:
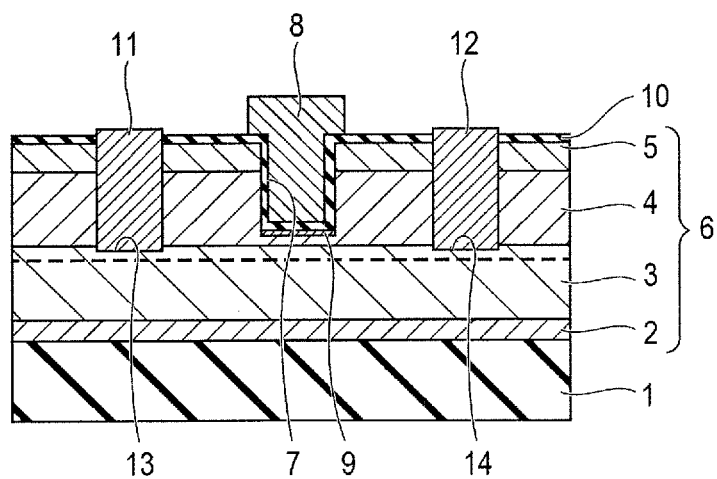
FIG. 2 is a schematic sectional view of a modification of the semiconductor device according to the first embodiment.

The fluorine-containing barrier film 9 may be placed over only the surface of the nitride semiconductor multilayer structure 6 (herein, the electron supply layer 4) that is exposed at the bottom of the gate recess 7 as illustrated in FIG. 2. That is, the fluorine-containing barrier film 9 may be placed over at least the surface of the nitride semiconductor multilayer structure 6 (herein, the electron supply layer 4) that is exposed at the bottom of the gate recess 7.

The fluorine-containing barrier film 9 is one having a barrier effect against moisture. The fluorine-containing barrier film 9 is preferably one having a high barrier effect against moisture, that is, one having high hydrophobicity. The fluorine-containing barrier film 9 can be defined as a film made of a compound (low-polarity molecules) of fluorine with an element, the difference in electro-negativity between fluorine and the element being less than about 2.0.

Herein, the fluorine-containing barrier film 9 is a fluorocarbon film (CF film). The fluorine-containing barrier film 9 may be any one selected from the group consisting of fluorocarbon films, boron fluoride films, films having a side-chain containing fluorocarbon, films having a side-chain containing boron fluoride, films having a side-chain containing oxygen fluoride, and films having a side-chain containing nitrogen fluoride. In particular, the fluorine-containing barrier film 9 may be any one selected from the group consisting of a CFx film, a BFx film, an M-CFx film having a side-chain containing CFx, an M-BFx film having a side-chain containing BFx, an M-OFx film having a side-chain containing OFx, and an M-NFx film having a side-chain containing NFx, wherein x is 1 to 4 and M is a metal or semiconductor element. The fluorine-containing barrier film 9 is one satisfying the above definition.

The reason for the presence of the fluorine-containing barrier film 9 is as described below.

The following layer is formed on a surface of a GaN layer and/or AlGaN layer that is etched in order to form a gate recess as described above: an altered layer containing a carbonaceous residue derived from a resist; a halogen element, such as fluorine or chlorine, generated from an etching gas; and an oxide. The altered layer lacks nitrogen. In other words, the altered layer has nitrogen defects, that is, dangling bonds.

In the case where an insulating film is formed over a surface of a nitride semiconductor multilayer structure having such an altered layer, an altered layer of GaN or AlGaN at the interface between the insulating film and a semiconductor and dangling bonds present on the surface of GaN or AlGaN act as electron traps and therefore the threshold voltage varies. In this case, the dangling bonds are terminated with fluorine in such a manner that residue present on a surface of the nitride semiconductor multilayer structure that is located in a gate recess and the altered layer are removed and fluorine termination treatment is performed, whereby the number of the dangling bonds is reduced and the variation of the threshold voltage is suppressed. However, when the time that a surface of the compound semiconductor multilayer structure subjected to fluorine termination treatment is exposed to air, that is, the time elapsed until the insulating film is formed on the surface thereof is long, the variation of the threshold voltage is not suppressed. The analysis of causes thereof has suggested that Al—F bonds and Ga—F bonds produced by fluorine termination treatment react with moisture in air and therefore fluorine is liberated.

Therefore, in this embodiment, a surface of the nitride semiconductor multilayer structure 6 is covered with the fluorine-containing barrier film 9 as illustrated in FIG. 1 such that dangling bonds present on a surface of the nitride semiconductor multilayer structure 6 are terminated with fluorine and thereby the variation of the threshold voltage is suppressed even though the elapsed time is long. That is, the fluorine-containing barrier film 9 is placed on at least a surface of the nitride semiconductor multilayer structure 6 that is located in the gate recess 7 (see FIG. 2), whereby the dangling bonds are terminated with fluorine and the contact of Al-F bonds and Ga-F bonds with moisture in air is suppressed. This allows a device which has high reliability without being affected by the elapsed time to be achieved.

In this embodiment, an insulating film 10 is placed on the fluorine-containing barrier film 9. That is, the insulating film 10 is placed above the nitride semiconductor multilayer structure 6 with the fluorine-containing barrier film 9 placed therebetween. In particular, the insulating film 10 is placed over a whole surface of the fluorine-containing barrier film 9. The gate electrode 8 is placed on the insulating film 10. That is, the gate electrode 8 is placed above the nitride semiconductor multilayer structure 6 with the fluorine-containing barrier film 9 and insulating film 10 placed there-between. A portion of the insulating film 10 that is disposed between the nitride semiconductor multilayer structure 6 and the gate electrode 8 functions as a gate insulating film and another portion thereof functions as a surface protective film.

When the fluorine-containing barrier film 9 is placed over only the surface of the nitride semiconductor multilayer structure 6 that is exposed at the bottom of the gate recess 7 (see FIG. 2), the insulating film 10 is placed over a whole surface of the fluorine-containing barrier film 9 and a whole surface of the nitride semiconductor multilayer structure 6 that is located on the gate electrode 8 side. The whole surface of the nitride semiconductor multilayer structure 6 that is located on the gate electrode 8 side includes the surface of the electron supply layer 4 that is exposed at the wall of the gate recess 7, the surface of the capping layer 5 that is exposed at the wall of the gate recess 7, and the surface of the capping layer 5 that is exposed on the gate electrode 8 side.

The insulating film 10 is an aluminum oxide film. The following materials can be used to form the insulating film 10 in addition to aluminum oxide: for example, hafnium oxide, silicon oxide, aluminum nitride, hafnium nitride, silicon nitride, and the like. That is, the insulating film 10 may be one containing an oxide, nitride, or oxy-nitride of at least one selected from the group consisting of aluminum, hafnium, tantalum, zirconium, and silicon. The insulating film 10 may have a single layer structure or a multilayer structure having two or more layers formed by depositing two or more of these materials.

A source electrode 11 and a drain electrode 12 are arranged on both sides of the gate electrode 8. That is, the source electrode 11 and the drain electrode 12 are spaced from each other with the gate electrode 8 placed there-between. In this embodiment, the nitride semiconductor multilayer structure 6 has a source electrode groove 13 and a drain electrode groove 14 and the source electrode 11 and the drain electrode 12 are placed in the source electrode groove 13 and the drain electrode groove 14, respectively. The source electrode groove 13 and the drain electrode groove 14 have a depth reaching the electron travel layer 3. Therefore, the source electrode 11 and the drain electrode 12 are in contact with the electron travel layer 3. In other words, the source electrode 11 and the drain electrode 12 are placed on the nitride semiconductor multilayer structure 6, that is, on the electron travel layer 3, which is included in the nitride semiconductor multilayer structure 6. Each of the source electrode groove 13 and the drain electrode groove 14 is also referred to as an electrode groove or a recessed portion.

A method for manufacturing the semiconductor device (MIS-type AlGaN/GaN-HEMT) according to this embodiment is described below with reference to FIGS. 3A to 3C.

Figure 3A:
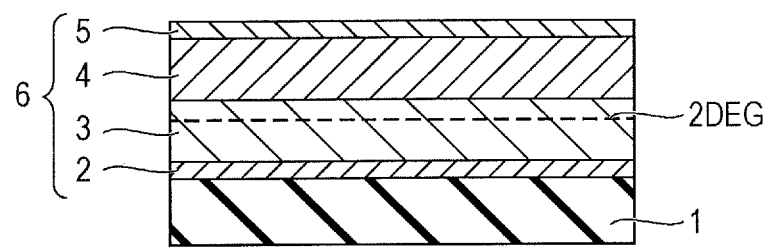
FIGS. 3A to 3C are schematic sectional views illustrating a method for manufacturing the semiconductor device according to the first embodiment.

As illustrated in FIG. 3A, AlN, GaN, AlGaN, and GaN are deposited on the SiC substrate 1 in that order by, for example, metal-organic vapor phase epitaxy (MOVPE). For example, AlN, i-GaN, i-AlGaN, n-AlGaN, and n-GaN are deposited on the SiC substrate 1, which is semi-insulating, in that order. This allows the nitride semiconductor multilayer structure 6, in which the nucleation layer 2, the electron travel layer 3, the electron supply layer 4, and the capping layer 5 are deposited on the SiC substrate 1 in that order, to be formed. Molecular beam epitaxy (MBE) or the like may be used instead of MOVPE.

A mixture of a tri-methyl aluminum gas, tri-methyl gallium gas, and ammonia gas which are source gases may be used to grow the nucleation layer 2, the electron travel layer 3, the electron supply layer 4, and the capping layer 5. The supply and flow rate of each of the tri-methyl aluminum gas, which is a source of Al, and the tri-methyl gallium gas, which is a source of Ga, may be appropriately controlled depending on the growth of the nucleation layer 2, the electron travel layer 3, the electron supply layer 4, and the capping layer 5. The flow rate of the ammonia gas, which is a common source gas, may be about 100 ccm to 10 LM. The growth pressure may be about 6,666 Pa to 39,996 Pa (about 50 Torr to 300 Torr). The growth temperature may be about 1,000° C. to 1,200° C. In order to grow AlGaN and GaN into an n-type, GaN and AlGaN may be doped with Si in such a manner that, for example, a $SiH_4$ gas containing Si, which is an n-type impurity, is added to the source gases at a predetermined flow rate. In this case, the doping concentration of Si is about $1\times10^{18}$ $cm^{-3}$ to $1\times10^{20}$ $cm^{-3}$ and may be, for example, about $5\times10^{18}$ $cm^{-3}$. The nucleation layer 2 may have a thickness of about 0.1 μm. The electron travel layer 3 may have a thickness of about 3 μm. The electron supply layer 4 includes an i-AlGaN sub-layer which may have a thickness of about 5 nm and an n-AlGaN sub-layer which may have a thickness of about 20 nm. The capping layer 5 may have a thickness of about 10 nm. The proportion of Al in the electron supply layer 4 may be, for example, about 0.2 to 0.3.

Figure 3B:
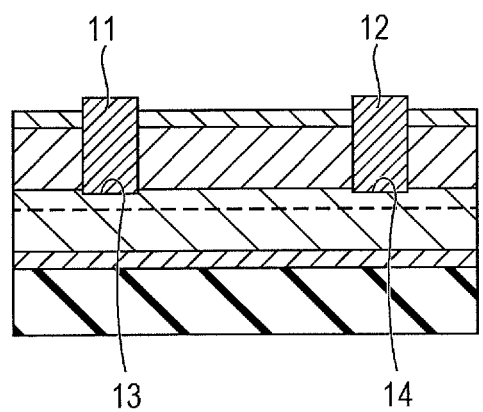

After an isolation region, which is not illustrated, is formed, the source electrode 11 and the drain electrode 12 are formed as illustrated in FIG. 3B.

In particular, the source electrode groove 13 and the drain electrode groove 14 are formed in a source electrode formation-planned region and drain electrode formation-planned region, respectively, of the nitride semiconductor multilayer structure 6. That is, portions of the capping layer 5, electron supply layer 4, and electron travel layer 3 are removed by, for example, lithography and dry etching using a chlorine-based gas or the like, the portions being included in the source electrode and drain electrode formation-planned regions, whereby the source electrode groove 13 and the drain electrode groove 14 are formed. As described above, the source electrode groove 13 and the drain electrode groove 14 are formed so as to extend through the capping layer 5 and the electron supply layer 4 to a predetermined depth in the electron travel layer 3.

Dry etching conditions are as described below. An etching gas used is, for example, a chlorine-based gas such as $Cl_2$. The flow rate of the etching gas is about 30 sccm and the pressure thereof is about 2 Pa. The input RF power may be about 20 W. The etching depth may be set such that the source electrode groove 13 and the drain electrode groove 14 are formed so as to reach a predetermined depth in the electron travel layer 3.

For example, Ta/Al is used as a material for forming the source electrode 11 and the drain electrode 12 and is filled in the source electrode groove 13 and the drain electrode groove 14 by, for example, a vapor deposition process and a lift-off process, whereby Ta/Al is deposited such that upper portions thereof protrude from the source electrode groove 13 and the drain electrode groove 14. Herein, the thickness of Ti may be about 20 nm and the thickness of Al may be about 200 nm. Thereafter, annealing is performed at a temperature of about 550° C. in, for example, a nitrogen atmosphere, whereby Ta/Al is caused to make ohmic contact with the electron travel layer 3. This allows the source electrode 11 and the drain electrode 12 to be formed as a pair of ohmic electrodes.

Figure 3C:
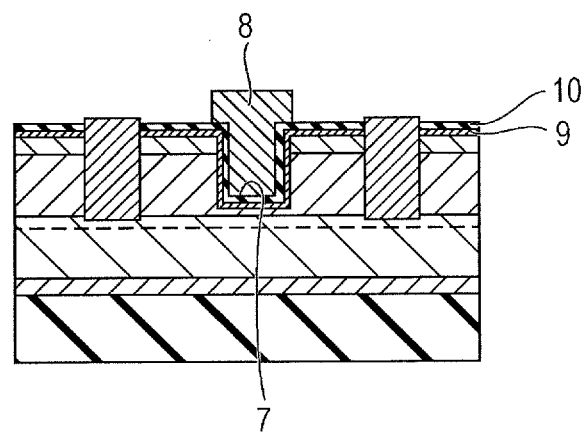

As illustrated in FIG. 3C, the gate recess 7 is formed in a gate electrode formation-planned region of the nitride semiconductor multilayer structure 6. In particular, a portion of the capping layer 5 and a portion of the electron supply layer 4 are removed by, for example, lithography and dry etching using a chlorine-based gas or the like, these portions being included in the gate electrode formation-planned region, whereby the gate recess 7 is formed. As described above, the gate recess 7 is formed in the form of a groove which extends through the capping layer 5 and which has such a thickness that a portion of the electron supply layer 4 remains. The gate recess 7 is not limited to such a groove. The gate recess 7 may be a groove that is formed by partly removing, for example, the capping layer 5, the electron supply layer 4, and the electron travel layer 3 so as to have such a thickness that a portion of the electron travel layer 3 remains.

Dry etching conditions are as described below. An etching gas used may be, for example, a fluorine-based gas such as $CF_4$, $CHF_3$, $C_4F_6$, $CF_3I$, or $SF_6$ or a chlorine-based gas such as $Cl_2$. The thickness of a remaining portion of the electron supply layer 4 is about 0 nm to 20 nm and may be, for example, about 1 nm.

Since the gate recess 7 is formed by dry etching as described above, residue adheres to the bottom and wall of the gate recess 7, that is, surfaces (herein a surface of the capping layer 5 and a surface of the electron supply layer 4) of the nitride semiconductor multilayer structure 6 that are exposed in the gate recess 7 and an altered layer having dangling bonds is formed.

Therefore, in order to remove the residue in the gate recess 7 and the altered layer, chemical solution treatment (wet etching) is performed. The residue in the gate recess 7 and the altered layer are removed by chemical solution treatment using, for example, a sulfuric acid-hydrogen peroxide mixture and hydrofluoric acid (HF), respectively. The hydrofluoric acid used may be diluted to a concentration of, for example, about 0.01% to 50%. The bottom and wall of the gate recess 7, which is disposed in the nitride semiconductor multilayer structure 6, are cleaned by such chemical solution treatment. The residue on the bottom of the gate recess 7 and the altered layer may be removed by subjecting the bottom of the gate recess 7 to chemical solution treatment. If none of the residue and the altered layer is formed in a step of forming the gate recess 7, a step of performing chemical solution treatment is not performed.

A surface of the nitride semiconductor multilayer structure 6 free from the residue and the altered layer has dangling bonds. Even though chemical solution treatment is performed as described above, a portion of the altered layer may possibly remain. In this case, this surface of the nitride semiconductor multilayer structure 6 has the altered layer portion, which has the dangling bonds. If chemical solution treatment for removing the altered layer is not performed, then the altered layer remains. In this case, the surface of the nitride semiconductor multilayer structure 6 has the altered layer having the dangling bonds.

Therefore, in order to terminate the dangling bonds with fluorine and in order to suppress the contact of Al-F bonds and Ga-F bonds with moisture in air, the fluorine-containing barrier film 9 is formed over the surface of the nitride semiconductor multilayer structure 6 that has the dangling bonds. That is, the fluorine-containing barrier film 9 is formed over the surfaces of the electron supply layer 4 that are exposed at the wall and bottom of the gate recess 7, the surfaces of the capping layer 5 that are exposed at the wall and bottom of the gate recess 7, and the surface of the capping layer 5 that is exposed on the side where the gate electrode 8 is placed.

The fluorine-containing barrier film 9 may be formed over at least a surface of the nitride semiconductor multilayer structure 6 (herein, the electron supply layer 4) that is exposed at the bottom of the gate recess 7 (see FIG. 2).

Herein, the fluorine-containing barrier film 9 is a fluorocarbon film (CF film) formed over a whole surface of the nitride semiconductor multilayer structure 6 by, for example, a chemical vapor deposition (CVD) process. The thickness of the fluorine-containing barrier film 9 may be, for example, about 1 nm to 10 nm and is herein about 5 nm. The fluorine-containing barrier film 9 may be any one selected from the group consisting of fluorocarbon films, boron fluoride films, films having a side-chain containing fluorocarbon, films having a side-chain containing boron fluoride, films having a side-chain containing oxygen fluoride, and films having a side-chain containing nitrogen fluoride. In particular, the fluorine-containing barrier film 9 may be any one selected from the group consisting of a CFx film, a BFx film, an M-CFx film having a side-chain containing CFx, an M-BFx film having a side-chain containing BFx, an M-OFx film having a side-chain containing OFx, and an M-NFx film having a side-chain containing NFx, wherein x is 1 to 4 and M is a metal or semiconductor element.

Next, the insulating film 10 (gate insulating film) is formed on the fluorine-containing barrier film 9. That is, the insulating film 10 is formed above the nitride semiconductor multilayer structure 6 with the fluorine-containing barrier film 9 placed there-between. In particular, the insulating film 10 is formed over a whole surface of the fluorine-containing barrier film 9. In other words, the insulating film 10 is formed on the fluorine-containing barrier film 9 so as to cover a whole surface of the nitride semiconductor multilayer structure 6 that is located on the side where the gate electrode 8 is placed, that is, the surfaces of the electron supply layer 4 that are exposed at the wall and bottom of the gate recess 7, the surfaces of the capping layer 5 that are exposed at the wall and bottom of the gate recess 7, and the surface of the capping layer 5 that is exposed on the side where the gate electrode 8 is placed.

When the fluorine-containing barrier film 9 is placed over only the surface of the nitride semiconductor multilayer structure 6 that is exposed at the bottom of the gate recess 7 (see FIG. 2), the insulating film 10 is formed over a whole surface of the fluorine-containing barrier film 9 and a whole surface of the nitride semiconductor multilayer structure 6 that is located on the side where the gate electrode 8 is placed. The whole surface of the nitride semiconductor multilayer structure 6 that is located on the side where the gate electrode 8 is placed includes the surface of the electron supply layer 4 that is exposed at the wall of the gate recess 7, the surface of the capping layer 5 that is exposed at the wall of the gate recess 7, and the surface of the capping layer 5 that is exposed on the side where the gate electrode 8 is placed.

The insulating film 10 is an aluminum oxide film and is formed over a whole surface of the fluorine-containing barrier film 9 by, for example, an atomic layer deposition (ALD) process. The thickness of the insulating film 10 may be, for example, about 5 nm to 100 nm and is herein about 40 nm. The insulating film 10 may be one containing an oxide, nitride, or oxy-nitride of at least one selected from the group consisting of aluminum, hafnium, tantalum, zirconium, and silicon. The insulating film 10 may have a single layer structure or a multilayer structure having two or more layers. The insulating film 10 may be formed by CVD or the like instead of the ALD process.

Next, the gate electrode 8 is formed on a portion of the insulating film 10 that is disposed in the gate recess 7. In other words, the gate electrode 8 is formed above the nitride semiconductor multilayer structure 6, that is, in the gate recess 7 formed in the nitride semiconductor multilayer structure 6 with the fluorine-containing barrier film 9 and insulating film 10 placed there-between.

In particular, a lower resist (for example, PMGI™ available from Microchem Corp., USA) and then an upper resist (for example, PFI32-A8™ available from Sumitomo Chemical Co., Ltd.) are applied to the insulating film 10 by, for example, a spin coating process. An opening with a diameter of, for example, about 0.8 µm is formed in a portion of the upper resist that is located above the gate recess 7 by ultraviolet exposure. The lower resist is wet-etched with an alkali developer using the upper resist as a mask. Gate metals (a layer of Ni with a thickness of about 10 nm and a layer of Al with a thickness of about 300 nm) are vapor-deposited over a surface including the opening formed in the lower resist and the upper resist and the gate recess 7 using the lower resist and the upper resist as a mask. Thereafter, the lower resist, the upper resist, the gate metals on the upper resist are removed by lift-off using a heated organic solvent. The gate electrode 8 is formed as described above. The gate electrode 8 fills the gate recess 7 with the fluorine-containing barrier film 9 and the insulating film 10 placed there-between, partly protrudes upward, and is made of Ni/Au.

Thereafter, the semiconductor device (MIS-type AlGaN/GaN-HEMT) is completed through a step of forming a protective film, a step of forming a contact hole, a step of forming a wiring line, and the like, which are not illustrated.

Thus, according to the semiconductor device and the method for manufacturing the same according to this embodiment, there is an advantage that dangling bonds on a surface of the nitride semiconductor multilayer structure 6 can be kept terminated with fluorine even if the elapsed time is long, the variation of the threshold voltage can be suppressed, and increased reliability can be achieved.

Figure 4:
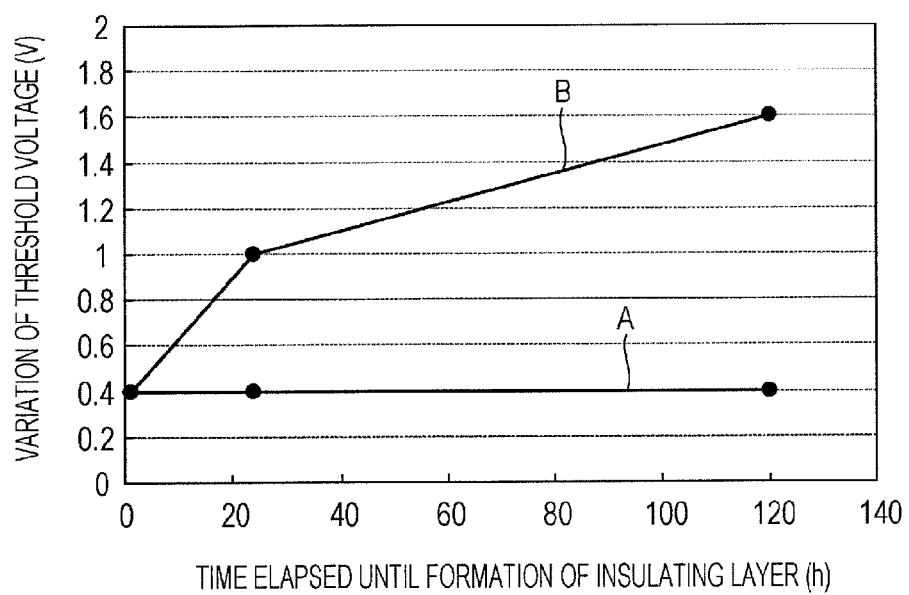
FIG. 4 is a graph illustrating an advantage of the semiconductor device according to the first embodiment.

FIG. 4 illustrates results obtained by measuring the variation of the threshold voltage in such a way that the time elapsed until fluorine termination treatment or between the formation of a fluorine-containing barrier film and the formation of an insulating film. In FIG. 4, Solid Line A indicates measurement results obtained in the case of forming the fluorine-containing barrier film 9 as described in this embodiment and Solid Line B indicates measurement results obtained in the case of performing fluorine termination treatment without forming any fluorine-containing barrier film in a comparative example.

As indicated by Solid Line B in FIG. 4, the variation of the threshold voltage increases with the increase of the elapsed time. In contrast, as indicated by Solid Line A in FIG. 4, the variation of the threshold voltage does not vary regardless of the elapsed time in the case of forming the fluorine-containing barrier film 9 as described in this embodiment. It has been confirmed that the liberation of fluorine due to placement in air is suppressed by forming the fluorine-containing barrier film 9 as described in this embodiment and a high-reliability device can be achieved independently of the elapsed time.

In this embodiment, the semiconductor device is described using the AlGaN/GaN-HEMI, which includes the electron travel layer 3 containing AlGaN and the electron supply layer 4 containing AlGaN, as an example. This embodiment is not limited to the AlGaN/GaN-HMT. This embodiment is applicable to, for example, an InAlN/GaN-HEMT including an electron travel layer containing GaN and an electron supply layer containing InAlN or an InAlGaN/GaN-HEMT including an electron travel layer containing GaN and an electron supply layer containing InAlGaN.

Figure 5:
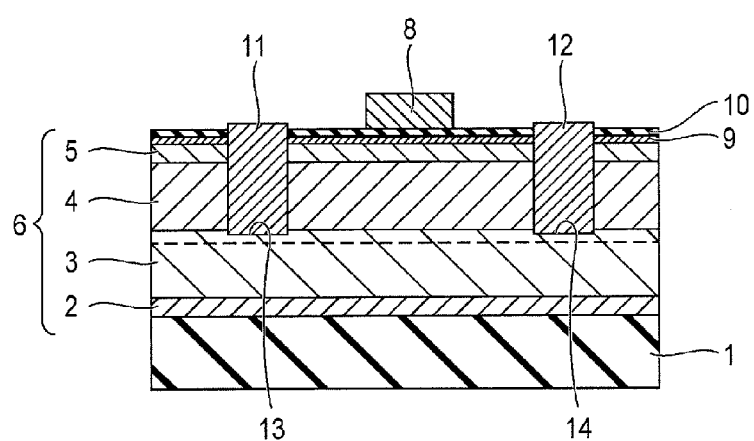
FIG. 5 is a schematic sectional view of a modification of the semiconductor device according to the first embodiment.

In this embodiment, the semiconductor device is described using the AlGaN/GaN-HEMT, which has the gate recess 7, as an example. This embodiment is not limited to the AlGaN/GaN-HEMT. This embodiment is applicable to a HEMT having no gate recess as illustrated in FIG. 5.

In the case of the HEMT having no gate recess, etching for forming a gate recess is not performed and therefore any altered layer having dangling bonds is not formed on a surface of a GaN layer or an AlGaN layer by etching for forming a gate recess. However, even though such an altered layer is not formed, dangling bonds are present on a surface of a nitride semiconductor multilayer structure. In the case of forming a gate electrode above the nitride semiconductor multilayer structure, the dangling bonds act as electron traps and therefore the threshold voltage varies. In this case, the dangling bonds are terminated with fluorine by subjecting a surface of the nitride semiconductor multilayer structure to fluorine termination treatment, whereby the number of the dangling bonds is reduced and the variation of the threshold voltage is suppressed. However, when the time that a surface of the compound semiconductor multilayer structure subjected to fluorine termination treatment is exposed to air, that is, the time elapsed until an insulating film is formed on the surface thereof is long, the variation of the threshold voltage is not suppressed. Therefore, in the HEMT having not gate recess, a surface of the nitride semiconductor multilayer structure 6 is covered with the fluorine-containing barrier film 9, whereby the dangling bonds on the surface of the compound semiconductor multilayer structure 6 are kept terminated with fluorine even if the elapsed time is long, the variation of the threshold voltage is suppressed, and increased reliability can be achieved. In this embodiment, the whole surface of the nitride semiconductor multilayer structure 6 that is located on the gate electrode 8 side is covered with the fluorine-containing barrier film 9 as exemplified above. This embodiment is not limited to such a configuration. At least a surface of the nitride semiconductor multilayer structure 6 that is exposed directly under the gate electrode 8 may be covered with the fluorine-containing barrier film 9.

In order to manufacture the HEMT having no gate recess, in the method according to this embodiment (see FIGS. 3A to 3C), after the source electrode 11 and the drain electrode 12 are formed, a step of forming the fluorine-containing barrier film 9, a step of forming the insulating film 10, and a step of forming the gate electrode 8 may be performed without performing a step of forming the gate recess 7. Actually, before the step of forming the fluorine-containing barrier film 9 is performed, a surface is preferably cleaned with, for example, a sulfuric acid-hydrogen peroxide mixture and hydrofluoric acid for the purpose of removing residue and native oxides due to etching for forming the source electrode 11 and the drain electrode 12.

In this embodiment and the modification, the semiconductor device is described using the MIS-type HEMT, which includes the insulating film 10 disposed between the nitride semiconductor multilayer structure 6 and the gate electrode 8, as an example. This embodiment and the modification are not limited to the MIS-type HEMT. This embodiment is applicable to, for example, a Schottky-type HEMT including no insulating film disposed between a nitride semiconductor multilayer structure and a gate electrode. In this case, the elapsed time is the time elapsed until a gate electrode is formed on a surface subjected to fluorine termination treatment.

[Second Embodiment]

A power supply system according to a second embodiment is described below with reference to FIG. 6.

The power supply system according to this embodiment includes the semiconductor device (HEMT) according to either of the first embodiment and the modification.

Figure 6:
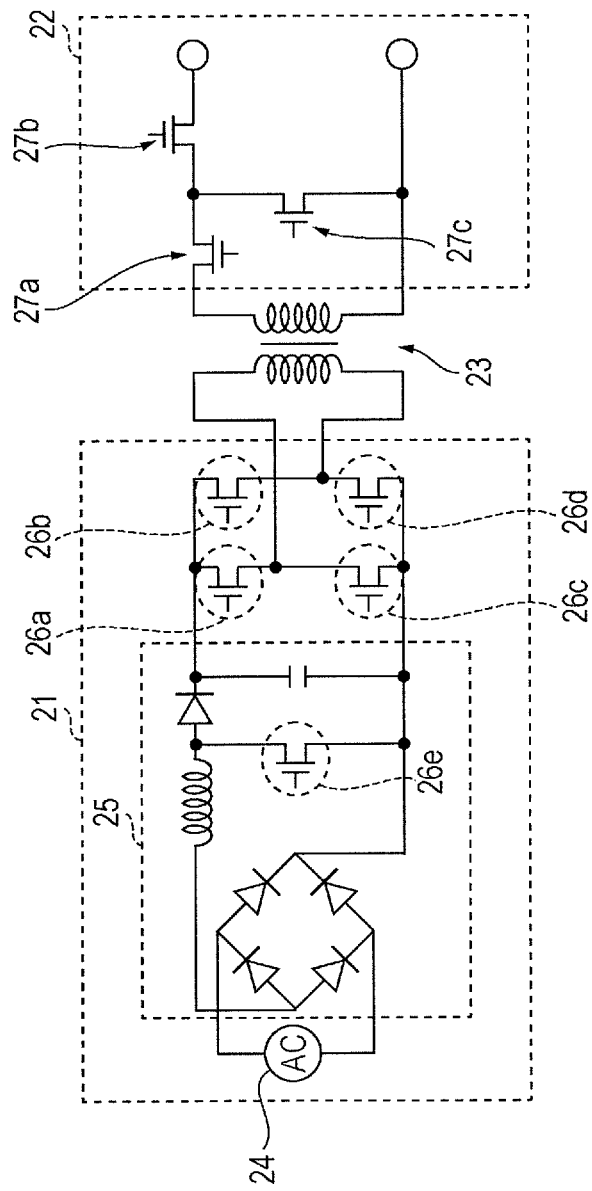
FIG. 6 is a schematic view of a power supply system according to a second embodiment.

With reference to FIG. 6, the power supply system includes a high-voltage primary circuit (high-voltage circuit) 21, a low-voltage secondary circuit (low-voltage circuit) 22, and a transformer (voltage inverter) 23.

The primary circuit 21 includes an alternating-current power supply 24, a so-called bridge rectifier circuit 25, and a plurality of switching elements 26a, 26b, 26c, and 26d (herein, the number thereof is four). The bridge rectifier circuit 25 includes a switching element 26e.

The secondary circuit 22 includes a plurality of switching elements 27a, 27b, and 27c (herein, the number thereof is three).

In this embodiment, the switching elements 26a, 26b, 26c, 26d, and 26e of the primary circuit 21 correspond to the semiconductor device (HEMT) according to either of the first embodiment and the modification. The switching elements 27a, 27b, and 27c of the secondary circuit 22 are common MIS-FETs containing silicon.

Thus, there is an advantage that the power supply system according to this embodiment can achieve high reliability because the semiconductor device (HEMT) according to either of the first embodiment and the modification is used in the primary circuit 21.

[Third Embodiment]

A high-frequency amplification unit according to a third embodiment is described below with reference to FIG. 7.

The high-frequency amplification unit according to this embodiment includes the semiconductor device (HEMT) according to either of the first embodiment and the modification.

Figure 7:
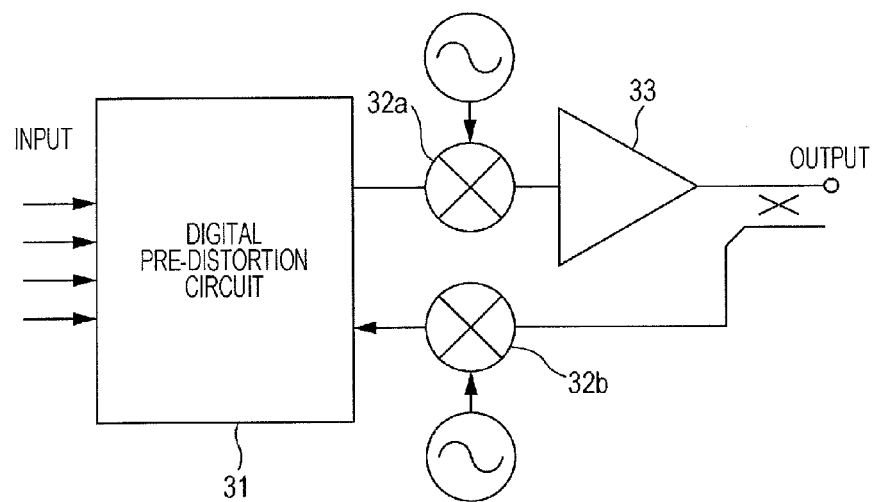
FIG. 7 is a schematic view of a high-frequency amplification unit according to a third embodiment.

With reference to FIG. 7, the high-frequency amplification unit includes a digital pre-distortion circuit 31, mixers 32a and 32b, and a power amplifier 33. The power amplifier 33 is also simply referred to as an amplifier.

The digital pre-distortion circuit 31 compensates for the nonlinear distortion of an input signal.

The mixers 32a and 32b mix an alternating-current signal with the input signal of which the nonlinear distortion is compensated for.

The power amplifier 33 amplifies the input signal mixed with the alternating-current signal and includes the semiconductor device (HEMT) according to either of the first embodiment and the modification.

With reference to FIG. 7, an output signal can be mixed with the alternating-current signal by the mixer 32b and can be transmitted to the digital pre-distortion circuit 31 by switching.

Thus, there is an advantage that the high-frequency amplification unit according to this embodiment can achieve high reliability because the semiconductor device (HEMT) according to either of the first embodiment and the modification is used in the power amplifier 33.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a compound semiconductor multilayer structure;
a fluorine-containing barrier film that covers a surface of the compound semiconductor multilayer structure;
an insulating film placed on the fluorine-containing barrier film; and
a gate electrode that is arranged over the compound semiconductor multilayer structure and placed on the insulating film with the fluorine-containing barrier film placed between the gate and the compound semiconductor multilayer structure,
wherein the fluorine-containing barrier film is any one selected from the group consisting of fluorocarbon films, boron fluoride films, films having a side-chain containing fluorocarbon, films having a side-chain containing boron fluoride, films having a side-chain containing oxygen fluoride, and films having a side-chain containing nitrogen fluoride.

2. The semiconductor device according to claim 1, wherein a nitride semiconductor multilayer structure includes a gate recess and the fluorine-containing barrier film covers at least a surface of the nitride semiconductor multilayer structure that is exposed at the bottom of the gate recess.

3. The semiconductor device according to claim 1, wherein the fluorine-containing barrier film covers a whole surface of the nitride semiconductor multilayer structure that is located on the gate electrode side.

4. The semiconductor of claim 1, wherein the insulating film contains an oxide, nitride, or oxy-nitride of at least one selected from the group consisting of aluminum, hafnium, tantalum, zirconium, and silicon.

5. A method for manufacturing a semiconductor device, comprising:
forming a nitride semiconductor multilayer structure;
forming a fluorine-containing barrier film over a surface of the nitride semiconductor multilayer structure;
forming an insulating film placed on the fluorine-containing barrier film; and
forming a gate electrode above the nitride semiconductor multilayer structure and placing it on the insulating film such that the fluorine-containing barrier film is located between the gate and the compound semiconductor multilayer structure,
wherein in the forming of the fluorine-containing barrier film, any one selected from the group consisting of fluorocarbon films, boron fluoride films, films having a side-chain containing fluorocarbon, films having a side-chain containing boron fluoride, films having a side-chain containing oxygen fluoride, and films having a side-chain containing nitrogen fluoride is formed.

6. The method according to claim 5, further comprising:
forming a gate recess in the nitride semiconductor multilayer structure prior to the forming of the fluorine-containing barrier film,
wherein in the forming of the fluorine-containing barrier film, the fluorine-containing barrier film is formed over at least a surface of the nitride semiconductor multilayer structure that is exposed at the bottom of the gate recess.

7. The method according to claim 6, further comprising:
subjecting at least the bottom of the gate recess to chemical solution treatment subsequently to the forming of the gate recess and prior to the forming of the fluorine-containing barrier film.

8. The method according to claim 5,
wherein in the forming of the fluorine-containing barrier film, the fluorine-containing barrier film is formed over a whole surface of the nitride semiconductor multilayer structure located on the side where the gate electrode is arranged.

9. The method according to claim 5, further comprising:
forming an insulating film on the fluorine-containing barrier film subsequently to the forming of the fluorine-containing barrier film,
wherein in the forming of the gate electrode, the gate electrode is formed on the insulating film.

10. The method according to claim 9,
wherein in the forming of the insulating film, the insulating film is formed so as to contain an oxide, nitride, or oxy-nitride of at least one selected from the group consisting of aluminum, hafnium, tantalum, zirconium, and silicon.

11. A power supply system comprising:
a transformer;
a high-voltage circuit; and
a low-voltage circuit,
wherein the transformer is placed between the high-voltage circuit and the low-voltage circuit, the high-voltage circuit includes a transistor, the transistor including a compound semiconductor multilayer structure, a fluorine-containing barrier film that covers a surface of the compound semiconductor multilayer structure, an insulating film placed on the fluorine-containing barrier film, and a gate electrode placed over the compound semiconductor multilayer structure and placed on the insulating film with the fluorine-containing barrier film placed between the gate and the compound semiconductor multilayer structure, and
wherein the fluorine-containing barrier film is any one selected from the group consisting of fluorocarbon films, boron fluoride films, films having a side-chain containing fluorocarbon, films having a side-chain containing boron fluoride, films having a side-chain containing oxygen fluoride, and films having a side-chain containing nitrogen fluoride.

\* \* \* \* \*